United States Patent
Chen et al.

(10) Patent No.: US 6,865,722 B2
(45) Date of Patent: Mar. 8, 2005

(54) METHOD OF AUTOMATING CHIP POWER CONSUMPTION ESTIMATION CALCULATION

(75) Inventors: Howard Hao Chen, Yorktown Heights, NY (US); Joachim G. Clabes, Austin, TX (US); Gricell Co, Austin, TX (US); James Scott Neely, Wappingers Falls, NY (US); Michael Fan Wang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 10/322,126

(22) Filed: Dec. 17, 2002

(65) Prior Publication Data

US 2004/0117745 A1 Jun. 17, 2004

(51) Int. Cl.⁷ .............................................. G06F 17/50
(52) U.S. Cl. ........................ 716/4; 716/1; 716/5; 716/6
(58) Field of Search ....................... 716/4–5, 1; 703/15; 702/60

(56) References Cited

U.S. PATENT DOCUMENTS

| | | | | |
|---|---|---|---|---|
| 5,754,435 A | * | 5/1998 | Sato ............................ | 702/60 |
| 6,321,185 B1 | * | 11/2001 | Takahashi ..................... | 703/15 |
| 6,338,025 B1 | * | 1/2002 | Bowen et al. ................. | 702/60 |
| 6,367,061 B1 | * | 4/2002 | Kurokawa et al. ............ | 716/10 |
| 6,598,209 B1 | * | 7/2003 | Sokolov ........................ | 716/4 |

* cited by examiner

*Primary Examiner*—Vuthe Siek
(74) *Attorney, Agent, or Firm*—Volel Emile; Robert M. Carwell

(57) ABSTRACT

An apparatus, system and method of automatically computing power consumption estimation of a chip are provided. The apparatus, system and method include determining all circuit blocks or macros embedded in the chip and retrieving from a file, into which pre-generated power consumption values of the macros are stored, the power consumption value of each macro. After doing so, the power consumption value of the chip is automatically computed. The apparatus, system and method also compute a desired power consumption estimation of the chip as well as a plurality of power densities. A desired power consumption estimation is based on a desired voltage and a desired frequency while a power density is power used in a certain area. Further, the apparatus, system and method reproduces the floorplan of the chip and represents each area within the chip by a different color to illustrate hot spots and cool spots.

20 Claims, 12 Drawing Sheets

| ASSOCIATED | OBJECTS | COORDINATES | ORIENTATIONS | WIDTH | HEIGHT |
|---|---|---|---|---|---|
| CHIP A | CHIP A | $X_0, Y_0$ | $O_0$ | $W_0$ | $H_0$ |
| | MACRO $A_2$ | $X_{A_1}, Y_{A_1}$ | $O_{A_1}$ | $W_{A_1}$ | $H_{A_1}$ |
| | MACRO $A_2$ | $X_{A_2}, Y_{A_2}$ | $O_{A_2}$ | $W_{A_2}$ | $H_{A_2}$ |
| | MACRO $A_3$ | $X_{A_3}, Y_{A_3}$ | $O_{A_3}$ | $W_{A_3}$ | $H_{A_3}$ |
| | UNIT $A_a$ | $X_{A_a}, Y_{A_a}$ | $O_{A_a}$ | $W_{A_a}$ | $H_{A_a}$ |
| | UNIT $A_b$ | $X_{A_b}, Y_{A_b}$ | $O_{A_b}$ | $W_{A_b}$ | $H_{A_b}$ |

FIG. 2
(PRIOR ART)

| ASSOCIATED | OBJECTS | COORDINATES | ORIENTATIONS | WIDTH | HEIGHT |
|---|---|---|---|---|---|
| UNIT $A_a$ | UNIT $A_a$ | $X_{A_a} Y_{A_a}$ | $O_{Aa}$ | $W_{Aa}$ | $H_{Aa}$ |
| | MACRO $A_1$ | $X_{Aa_1} Y_{Aa_1}$ | $O_{Aa_1}$ | $W_{Aa_1}$ | $H_{Aa_1}$ |
| | MACRO $A_2$ | $X_{Aa_2} Y_{Aa_2}$ | $O_{Aa_2}$ | $W_{Aa_2}$ | $H_{Aa_2}$ |
| | MACRO $A_3$ | $X_{Aa_3} Y_{Aa_3}$ | $O_{Aa_3}$ | $W_{Aa_3}$ | $H_{Aa_3}$ |

FIG. 3
(PRIOR ART)

| ASSOCIATED | OBJECTS | COORDINATES | ORIENTATIONS | WIDTH | HEIGHT |
|---|---|---|---|---|---|
| UNIT $A_b$ | UNIT $A_b$ | $X_{Ab}\ Y_{Ab}$ | $O_{Ab}$ | $W_{Ab}$ | $H_{Ab}$ |
| | MACRO $A_{b_1}$ | $X_{Ab_1}\ Y_{Ab_1}$ | $O_{Ab_1}$ | $W_{Ab_1}$ | $H_{Ab_1}$ |
| | MACRO $A_{bA}$ | $X_{AbA}\ Y_{AbA}$ | $O_{AaA}$ | $W_{AbA}$ | $H_{AbA}$ |

FIG. 4
(PRIOR ART)

| ASSOCIATED | OBJECTS | COORDINATES | ORIENTATIONS | WIDTH | HEIGHT |
|---|---|---|---|---|---|
| UNIT $A_{bA}$ | UNIT AbA | $X_{AbA}, Y_{AbA}$ | $O_{AbA}$ | $W_{AbA}$ | $H_{AbA}$ |
| | MACRO $AbA_1$ | $X_{AbA_1}, Y_{AbA_1}$ | $O_{AbA_1}$ | $W_{AbA_1}$ | $H_{AbA_1}$ |
| | MACRO $AbA_2$ | $X_{AbA_2}, Y_{AbA_2}$ | $O_{AbA_2}$ | $W_{AbA_2}$ | $H_{AbA_2}$ |

FIG. 5
(PRIOR ART)

| REPRESENTATION | MIRROR IMAGE | DEGREES OF ROTATION | SHORTHAND |
|---|---|---|---|
| F | NO | 0 | N0 |
| F | NO | 90 | N90 |
| F | NO | 180 | N180 |
| F | NO | 270 | N270 |
| F | YES | 0 | Y0 |
| F | YES | 90 | Y90 |
| F | YES | 180 | Y180 |
| F | YES | 270 | Y270 |

FIG. 6
(PRIOR ART)

| | COORDINATES | ORIENTATIONS | WIDTH | HEIGHT | POWER |
|---|---|---|---|---|---|
| | | | | | |
| MACRO$_{A_1}$ | $X_0, Y_0$ | $O_0$ | $W_0$ | $H_0$ | |
| MACRO$_{A_2}$ | $X_{A_1}, Y_{A_1}$ | $O_{A_1}$ | $W_{A_1}$ | $H_{A_1}$ | $P_{A_1}$ |
| MACRO$_{A_3}$ | $X_{A_2}, Y_{A_2}$ | $O_{A_2}$ | $W_{A_2}$ | $H_{A_2}$ | $P_{A_2}$ |
| | $X_{A_3}, Y_{A_3}$ | $O_{A_3}$ | $W_{A_3}$ | $H_{A_3}$ | $P_{A_3}$ |
| UNIT $A_a$ — MACRO$_{Aa_1}$ | $X_{Aa}, Y_{Aa}$ | $O_{Aa}$ | $W_{Aa}$ | $H_{Aa}$ | |
| MACRO$_{Aa_2}$ | $X_{Aa_1}, Y_{Aa_1}$ | $O_{Aa_1}$ | $W_{Aa_1}$ | $H_{Aa_1}$ | $P_{Aa_1}$ |
| MACRO$_{Aa_3}$ | $X_{Aa_2}, Y_{Aa_2}$ | $O_{Aa_2}$ | $W_{Aa_2}$ | $H_{Aa_2}$ | $P_{Aa_2}$ |
| | $X_{Aa_3}, Y_{Aa_3}$ | $O_{Aa_3}$ | $W_{Aa_3}$ | $H_{Aa_3}$ | $P_{Aa_3}$ |
| UNIT $A_b$ — MACRO$_{Ab_1}$ | $X_{Ab}, Y_{Ab}$ | $O_{Ab}$ | $W_{Ab}$ | $H_{Ab}$ | |
| | $X_{Ab_1}, Y_{Ab_1}$ | $O_{Ab_1}$ | $W_{Ab_1}$ | $H_{Ab_1}$ | $P_{Ab_1}$ |
| UNIT$_{AbA}$ — MACRO$_{AbA_1}$ | $X_{AbA}, Y_{AbA}$ | $O_{AbA}$ | $W_{AbA}$ | $H_{AbA}$ | |
| MACRO$_{AbA_2}$ | $X_{AbA_1}, Y_{AbA_1}$ | $O_{AbA_1}$ | $W_{AbA_1}$ | $H_{AbA_1}$ | $P_{AbA_1}$ |
| | $X_{AbA_2}, Y_{AbA_2}$ | $O_{AbA_2}$ | $W_{AbA_2}$ | $H_{AbA_2}$ | $P_{AbA_2}$ |

(CHIP A)

FIG. 8

|  | $P_R$ 902 | $P_{RD}$ 904 | $P_D$ 906 | $P_{DD}$ 908 |
|---|---|---|---|---|
|  | $P_R$ (CHIP) 910 | $P_{RD}$ (CHIP) 912 | $P_D$ (CHIP) 914 | $P_{DD}$ (CHIP) 916 |
| MACRO$_{A_1}$ | $P_R$ (A$_1$) | $P_{RD}$ (A$_1$) | $P_D$ (A$_1$) | $P_{DD}$ (A$_1$) |
| MACRO$_{A_2}$ | $P_R$ (A$_2$) | $P_{RD}$ (A$_2$) | $P_D$ (A$_2$) | $P_{DD}$ (A$_2$) |
| MACRO$_{A_3}$ | $P_R$ (A$_3$) | $P_{RD}$ (A$_3$) | $P_D$ (A$_3$) | $P_{DD}$ (A$_3$) |
| UNIT A$_a$ | $P_R$ (UNIT Aa) 920 | $P_{RD}$ (UNIT Aa) 922 | $P_D$ (UNIT Aa) 924 | $P_{DD}$ (UNIT Aa) 926 |
| MACRO$_{Aa_1}$ | $P_R$ (Aa$_1$) | $P_{RD}$ (Aa$_1$) | $P_D$ (Aa$_1$) | $P_{DD}$ (Aa$_1$) |
| MACRO$_{Aa_2}$ | $P_R$ (Aa$_2$) | $P_{RD}$ (Aa$_2$) | $P_D$ (Aa$_2$) | $P_{DD}$ (Aa$_2$) |
| MACRO$_{Aa_3}$ | $P_R$ (Aa$_3$) | $P_{RD}$ (Aa$_3$) | $P_D$ (Aa$_3$) | $P_{DD}$ (Aa$_3$) |
| UNIT A$_b$ | $P_R$ (UNIT Ab) 930 | $P_{RD}$ (UNIT Ab) 932 | $P_D$ (UNIT Ab) 934 | $P_{DD}$ (UNIT Ab) 936 |
| MACRO$_{Ab_1}$ | $P_R$ (Ab$_1$) | $P_{RD}$ (Ab$_1$) | $P_D$ (Ab$_1$) | $P_{DD}$ (Ab$_1$) |
| UNIT$_{AbA}$ | $P_R$ (UNIT AbA) 940 | $P_{RD}$ (UNIT AbA) 942 | $P_D$ (UNIT AbA) 944 | $P_{DD}$ (UNIT AbA) 946 |
| MACRO$_{AbA_1}$ | $P_R$ (AbA$_1$) | $P_{RD}$ (AbA$_1$) | $P_D$ (AbA$_1$) | $P_{DD}$ (AbA$_1$) |
| MACRO$_{AbA_2}$ | $P_R$ (AbA$_2$) | $P_{RD}$ (AbA$_2$) | $P_D$ (AbA$_2$) | $P_{DD}$ (AbA$_2$) |

CHIP A

FIG. 9

METHOD OF AUTOMATING CHIP POWER CONSUMPTION ESTIMATION CALCULATION

BACKGROUND OF THE INVENTION

1. Technical Field

The present invention is directed generally to integrated circuit technology. More specifically, the present invention is directed to a method of automating chip power consumption estimation.

2. Description of Related Art

As is well known in the art, the more digital logic integrated in a chip, the more power the chip consumes. It is further well known that many important design issues and parameters are strongly dependent on the power dissipation of the chip. And, since only a limited amount of heat can be dissipated through a chip's package, it is imperative that power consumption of chips be taken into account during the design process.

To this end, many techniques have been developed to estimate power consumption of chip at the design stage. One such technique includes pre-generating estimated power consumption values of circuit blocks or macros and storing the values in a file. These macros may be used once or a plurality of times to design different chips. In any event, once a chip incorporating these macros is designed, its estimated power consumption may quickly be calculated. To do so, one needs only determine the different macros as well as the number of instances each macro is used in the chip. Once this is determined, the estimated value of the macros may be obtained from the file and added together to arrive at the estimated power consumption of the chip.

Presently, the above-described chip-level power estimation is performed manually. This can be quite a time-consuming and calculation-intensive endeavor. For example, a typical microprocessor may contain more than one thousand (1,000) unique macros and each macro may be used more than 20,000 times. Hence, to compute the power estimation of the chip, 1,000 different values have to be retrieved from the file and used each more than 20,000 times.

Further, the design of a chip may constantly be changing. For every change, a new power estimation may have to be calculated. Thus, the amount of work that may have to be performed in obtaining the power estimation of a chip during its design process may be staggering. And, as with any task performed manually, this power estimation calculation is prone to errors.

Thus, what is needed is an apparatus, system and method of automating chip power consumption estimation.

SUMMARY OF THE INVENTION

The present invention provides an apparatus, system and method of automatically computing power consumption estimation of a chip. The apparatus, system and method include determining all circuit blocks or macros embedded in the chip and retrieving from a file, into which pre-generated power consumption values of the macros are stored, the power consumption value of each macro. After doing so, the power consumption value of the chip is automatically computed.

The apparatus, system and method also compute a desired power consumption estimation of the chip as well as a plurality of power densities. A desired power consumption estimation is based on a desired voltage and a desired frequency while a power density is power used in a certain area. Further, the apparatus, system and method reproduces the floorplan of the chip and represents each area within the chip by a different color to illustrate hot spots and cool spots.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 illustrates an exemplary file associated with a chip.

FIG. 3 illustrates a cross-reference table in an exemplary file associated with a first functional unit.

FIG. 4 illustrates a cross-reference table in an exemplary file associated with a second functional unit.

FIG. 5 illustrates a cross-reference table in an exemplary file associated with a sub-functional unit.

FIG. 6 depicts a list of different orientations and their shorthand notations.

FIG. 8 illustrates a first cross-reference table of a datafile used by the present invention.

FIG. 9 illustrates a second cross-reference table of a datafile used by the present invention.

DETAILED DESCRIPTION OF THE PREFERRED EMBODIMENT

In the following disclosed implementation of the invention, a software program is used to retrieve information stored in files in order to reconstruct a chip floorplan. From the floorplan, instance counts of macros used in the chip may be obtained. Once the instance counts are obtained, the power consumed by each macro may be retrieved from a database to calculate the power consumption of the chip or any functional unit therein. Further, power density may be computed for any macro, functional unit or the chip itself. Power density is the power over a particular area of the chip.

In designing high frequency/performance VLSI (very large scale integration) processors with significant architectural complexity, a concept known as chip integration is often used. In chip integration, a combination of critical physical design techniques is given prioritized consideration throughout all phases of the design process. These critical design techniques include power distribution, high-speed clock design, wiring methodologies, circuit macro floorplanning, chip-level timing/extraction, noise prevention, electrical analysis, design verification, and time to market. This concept is a key requirement necessary not only to achieve high frequency of operation, but also to meet area targets within a defined architecture and ensure a robust and reliable design for transistor counts from 10 to 100 million.

One of the standard outputs of an integration tool is a plurality of files that contain each a list of objects and a number of their instances in the chip. An object may be a macro or a functional unit. An example of a functional unit is an instruction unit; a branch control element unit, which contains the cache and its associated controls; an execution unit, which contains both a fixed-point unit and a floating-point unit; or a register checkpoint unit, used for full error checking and processor recovery.

Each generated file is associated with a functional unit. In this case, the chip itself may be regarded as a functional unit and will therefore have an associated file (i.e., a chip file). The chip file contains a list of all the macros and functional units that make up the chip. The listed functional units in the chip file will each have their own associated file (i.e., a unit file). If a functional unit comprises a sub-functional unit, the sub-functional unit will also have an associated file (i.e., a sub-unit file) and so on. For example, the execution unit listed above has a fixed-point unit and floating-point unit. Thus, if the execution unit is incorporated in the chip, it will have a unit file that lists the fixed-point unit and the floating-point unit and any additional macro that it contains. The fixed-point unit and the floating-point unit will each have an associated sub-unit file.

Figure 1:
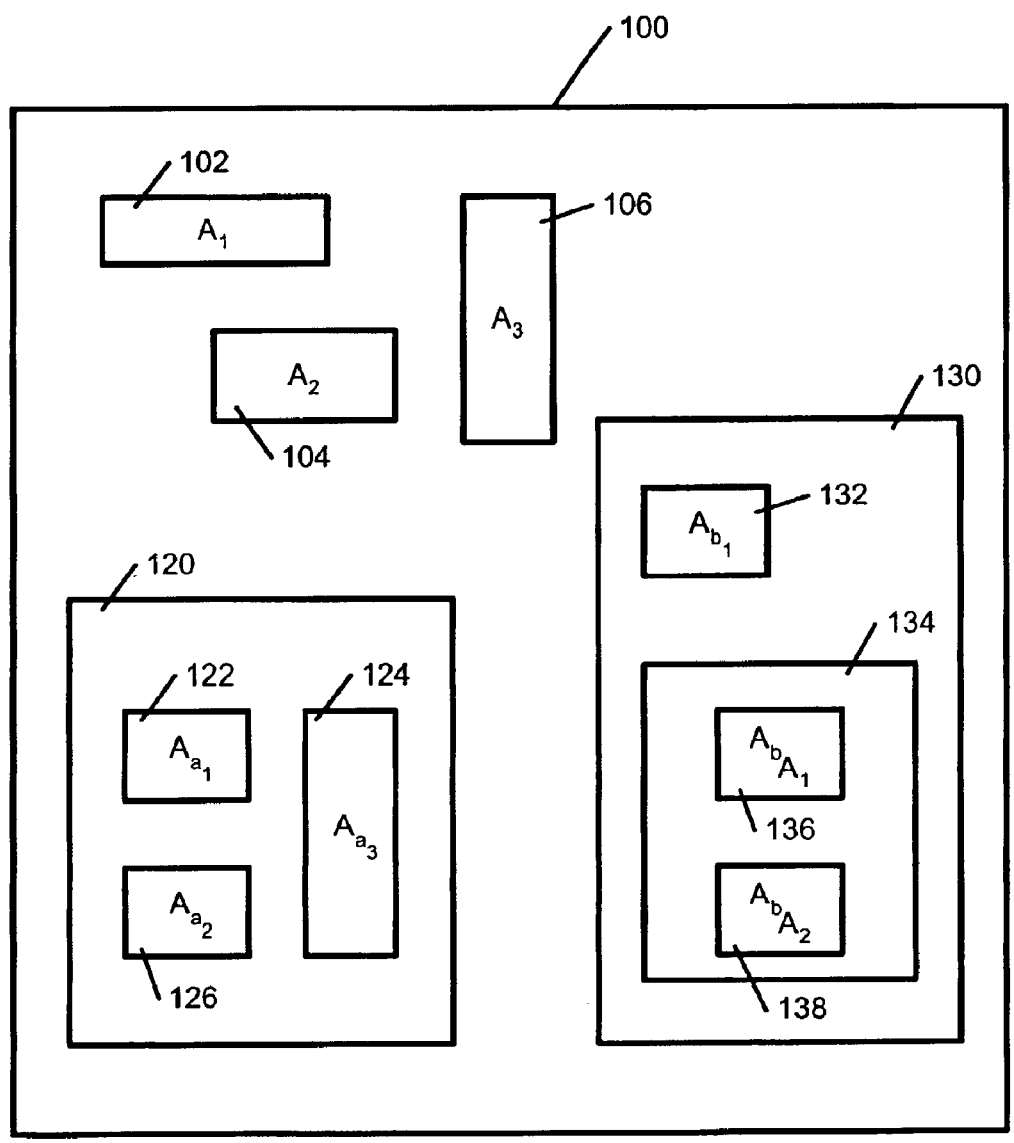
FIG. 1 is a block diagram of a chip.

FIG. 1, which depicts a hypothetical chip A 100, is used as an illustration. Chip A 100 includes macros $A_1$ 102, $A_2$ 104, $A_3$ 106 and functional units $A_a$ 120 and $A_b$ 130. Consequently, in the file associated with chip A 100, macros $A_1$ 102, $A_2$ 104, $A_3$ 106 and functional units $A_a$ and $A_b$ will be listed. There will also be a unit file for functional units $A_a$ and $A_b$. The unit file for functional unit $A_a$ 120 will contain macros $A_{a1}$ 122, $A_{a2}$ 126 and $A_{a3}$ 124 whereas that for the functional unit $A_b$ 130 will contain macro $A_{b1}$ 132 and functional unit $A_{bA}$ 134. As functional unit $A_b$ 130 contains a sub-functional unit (i.e., functional unit $A_{bA}$), there will also be a sub-unit file. The sub-unit file will contain macros $A_{bA1}$ 136 and $A_{bA2}$ 138.

Figure 7:
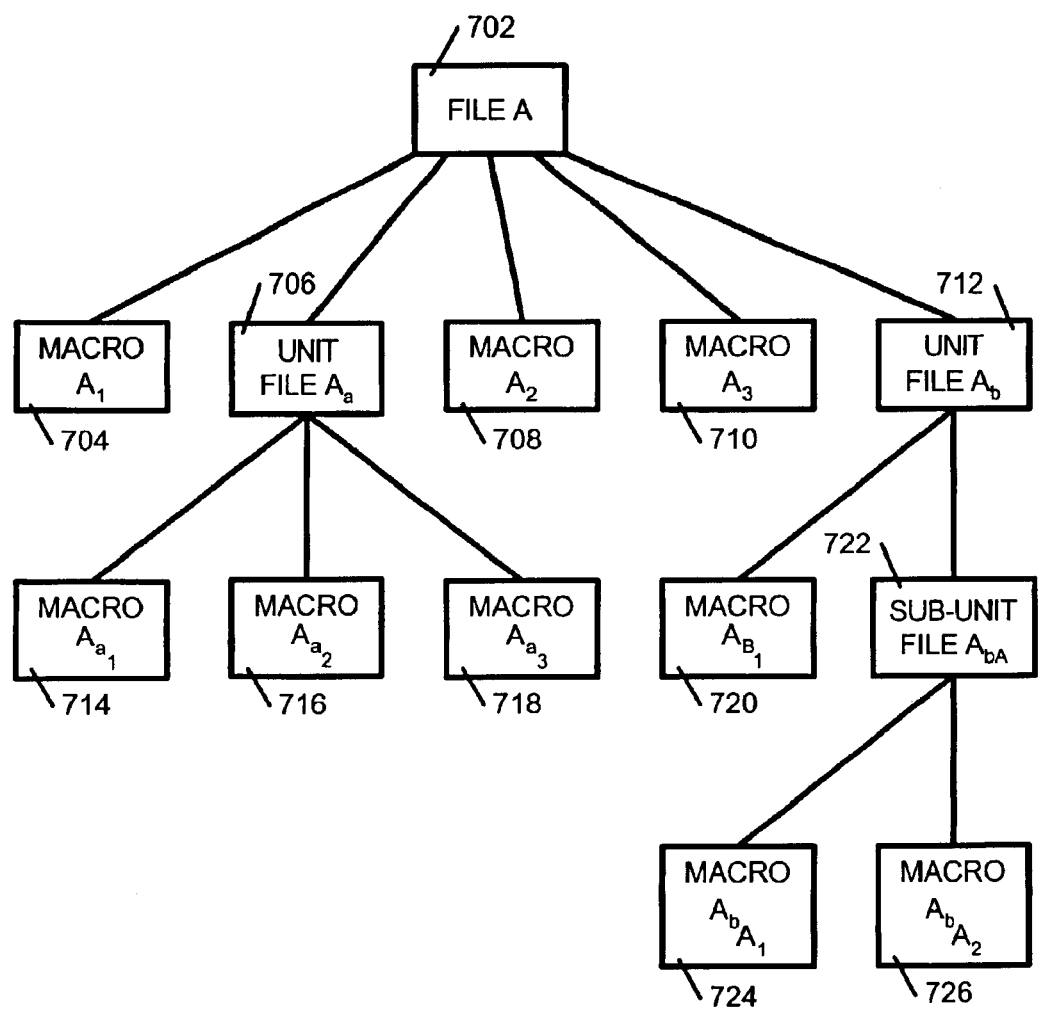
FIG. 7 depicts an inverted tree-structure of a file system.

Thus, the different files that are associated with the chip may be regarded as an inverted tree-structure where the macros are leaves and the functional units are nodes or branches. FIG. 7 illustrates such an inverted tree-structure where file A 702, unit files $A_a$ 706 and $A_b$ 712 as well as sub-unit file $A_{bA}$ 722 are nodes and macros $A_1$ 704, $A_2$ 708, $A_3$ 710, $A_{a1}$ 714, $A_{a2}$ 716, $A_{a3}$ 718, $A_{b1}$ 720, $A_{bA1}$ 724 and $A_{bA2}$ 726 are leaves.

In addition to having a list of the macros and functional units that make up a chip and/or a functional unit, each file may provide location, orientation, shape/size of each macro and functional unit listed therein. FIG. 2 illustrates an exemplary file. The file is associated with chip A, which has reference coordinates $X_0Y_0$, orientation $O_0$, width $W_0$ and height $H_0$. The width $W_0$ and height $H_0$, when used in conjunction with reference coordinates $X_0Y_0$, allow the shape and size of chip A to be reproduced. Particularly, the shape of all objects (i.e., chips, macros and functional units) is assumed to be a rectangle with the listed reference coordinates being the bottom left corner of the rectangle. Hence, the shape and size of the rectangle representing chip A may easily be drawn using the reference coordinates and its width and height.

Orientation $O_0$ provides more information about Chip A. FIG. 6 depicts a list of different orientations and their shorthand notations. The letter N in N0, N90, N180 and N270 signifies that an object, when recreated, should be a true image, as opposed to a mirror image, of itself. The 0, 90, 180 and 270 are degrees of rotation. The letter Y, in the case of Y0, Y90, Y180 and Y270, denotes that a recreated object should be a mirror image of itself. And, just as before the 0, 90, 180 and 270 are degrees of rotation. Since the rectangles representing the macros and functional units integrated in chip A will be drawn relative to the rectangle representing chip A, then the coordinates $X_0Y_0$ may be regarded as (0,0) and the orientation $O_0$ may be N0.

Returning to FIG. 2, the coordinates for macro $A_1$ are $X_{A1}Y_{A1}$, and as mentioned above, they are relative to the coordinates $X_0Y_0$ of Chip A. Likewise, coordinates $X_{A2}Y_{A2}$, $X_{A3}Y_{A3}$, $X_{Aa}Y_{Aa}$ and $X_{Ab}Y_{Ab}$ of macros $A_2$, $A_3$ and functional units $A_a$ and $A_b$, respectively, are relative to the coordinates $X_0Y_0$. Again, using the coordinates of each object, in conjunction with the width and height of the object, allows for the object to be reproduced.

FIGS. 3 and 4 depict the files associated with functional units $A_a$ and $A_b$ in FIG. 2 and FIG. 5 illustrates the file associated with sub-functional unit $A_{bA}$ in FIG. 4. As in FIG. 2, each object in FIGS. 3, 4 and 5 has a set of reference coordinates, a width and a height as well as an orientation. The coordinates of each macro or functional unit in a unit or sub-unit file are relative to the coordinates of the object (i.e., the functional unit) with which the file is associated. Thus, to have the reference coordinates of a macro of a functional unit in a sub-unit file be relative to the coordinates of a chip, the reference coordinates of each intervening functional unit have to be summed up. For example, $X_{AbA2}Y_{AbA2}$ of macro $A_{bA2}$ 138 of FIG. 1 may be made relative to the coordinates of chip A (i.e., $X_0Y_0$) by having:

$$X'_{AbA2}=X_{AbA2}+X_{AbA}+X_{Ab}$$

$$Y'_{AbA2}=Y_{AbA2}+Y_{AbA}+Y_{Ab}$$

where $X'_{AbA2}$ and $Y'_{AbA2}$ are the coordinates of the macro $A_{bA2}$ that are relative to $X_0Y_0$, $X_{AbA2}$ and $Y_{AbA2}$ are the coordinates of macro $A_{AbA2}$ relative to coordinates of functional unit $A_{bA}$ 134 of FIG. 1, $X_{AbA}$ and $Y_{AbA}$ are the coordinates of functional unit $A_{bA}$ relative to coordinates of functional unit $A_b$ 130 of FIG. 1 and $X_{Ab}$ and $Y_{Ab}$ are the coordinates of functional unit $A_b$ relative to coordinates of chip A 100 (i.e., $X_0Y_0$) of FIG. 1.

Likewise, the orientation of a macro or a functional unit in a unit or sub-unit file is relative to the orientation of the object with which the file is associated. As in the case of the reference coordinates, an orientation of a sub-functional unit or macro may be made relative to a chip in which the functional unit or macro is embedded by adding the orientation of all intervening functional units to the orientation of the sub-functional unit or macro. For example, if the orientation of the macro $A_{bA2}$ 138 was 270° and the orientation of functional unit $A_{bA}$ 134 was 180° and the orientation of functional unit $A_b$ 130 was 90° then the orientation of the macro $A_{bA2}$ relative to chip A would be:

$$270°+180°+90°=540° \text{ or } 180°$$

As previously mentioned, the invention is a software program that uses information stored in the files described above to reconstruct a chip floorplan as well as computing the chip's power consumption estimation. The program accesses each file generated by the integration tool to obtain physical attributes of each macro or functional unit in the chip. For example, in the case of chip A in FIG. 1, the program will access the files shown in FIGS. 2, 3, 4 and 5 to obtain the reference coordinates, width, height and orientation of each macro and functional unit embedded therein. The program will also access the database where the power consumption estimation of the macros is stored to retrieve the power consumption of each macro used in chip A.

As the program is accessing the files and the power database, it will build a database to store the retrieved information. FIG. 8 depicts the database in which information (including power consumption) regarding the macros and functional units used in chip A is stored. After collecting and storing the information in the database, the invention may reproduce the floorplan of the chip, compute the raw power consumption estimation of the chip as well as calculate different raw power densities.

The invention may also compute desired power consumption estimations. To do so, the invention uses the following formula:

$$P_{desired}=P_{raw}(V_{desired}/V_{raw})^2(F_{desired}/F_{raw})$$

where $P_{desired}$ is the power that is being computed, $P_{raw}$ is the power estimation of the power that is being computed, $V_{desired}$ is the voltage at which $P_{desired}$ is to be computed, $V_{raw}$ is the voltage at which $P_{raw}$ was computed, $F_{desired}$ is the frequency at which $P_{desired}$ is to be computed and $F_{raw}$ is the frequency at which $P_{raw}$ was computed.

Thus, if $P_{desired}$ is to be computed, $V_{desired}$ and $F_{desired}$ are to be provided to the program, otherwise only $P_{raw}$ will be computed. Note that the power consumption of each macro includes $V_{raw}$ and $F_{raw}$.

FIG. 9 is a table into which all calculated values may be stored. This table may be part of the database built by the program. The table has a $P_{raw}$ column 902 into which the $P_{raw}$ of each object (i.e., chip, units and macros) is stored. The $P_{raw}$ of an object may be calculated or retrieved. $P_{raw}$ 910 of the chip, $P_{raw}$ 920 of unit $A_a$, $P_{raw}$ 930 of unit $A_b$ and $P_{raw}$ 940 of unit $A_{bA}$ are calculated whereas the ones for the macros are retrieved from files 2, 3, 4 and 5.

The table also has a $P_{raw}$ density column 904, a $P_{desired}$ column 906 and $P_{desired}$ density column 908. The $P_{raw}$ density, $P_{desired}$ and $P_{desired}$ density of all the objects are calculated. The $P_{desired}$ of an object is calculated according to the equation disclosed above. The $P_{raw}$ density and $P_{desired}$ density are a particular power over a particular area. For example, the $P_{raw}$ density of the chip is the $P_{raw}$ of the chip divided by the total area of the chip.

Once the different values are calculated, the database may be disseminated as a text file or as an HTML file or browser page. Further, graphical representation of the data may be generated. For instance, the chip floorplan may be reproduced with a different colored shading to illustrate areas that have a high power consumption (i.e., hot spots) or low power consumption etc.

Figure 10:
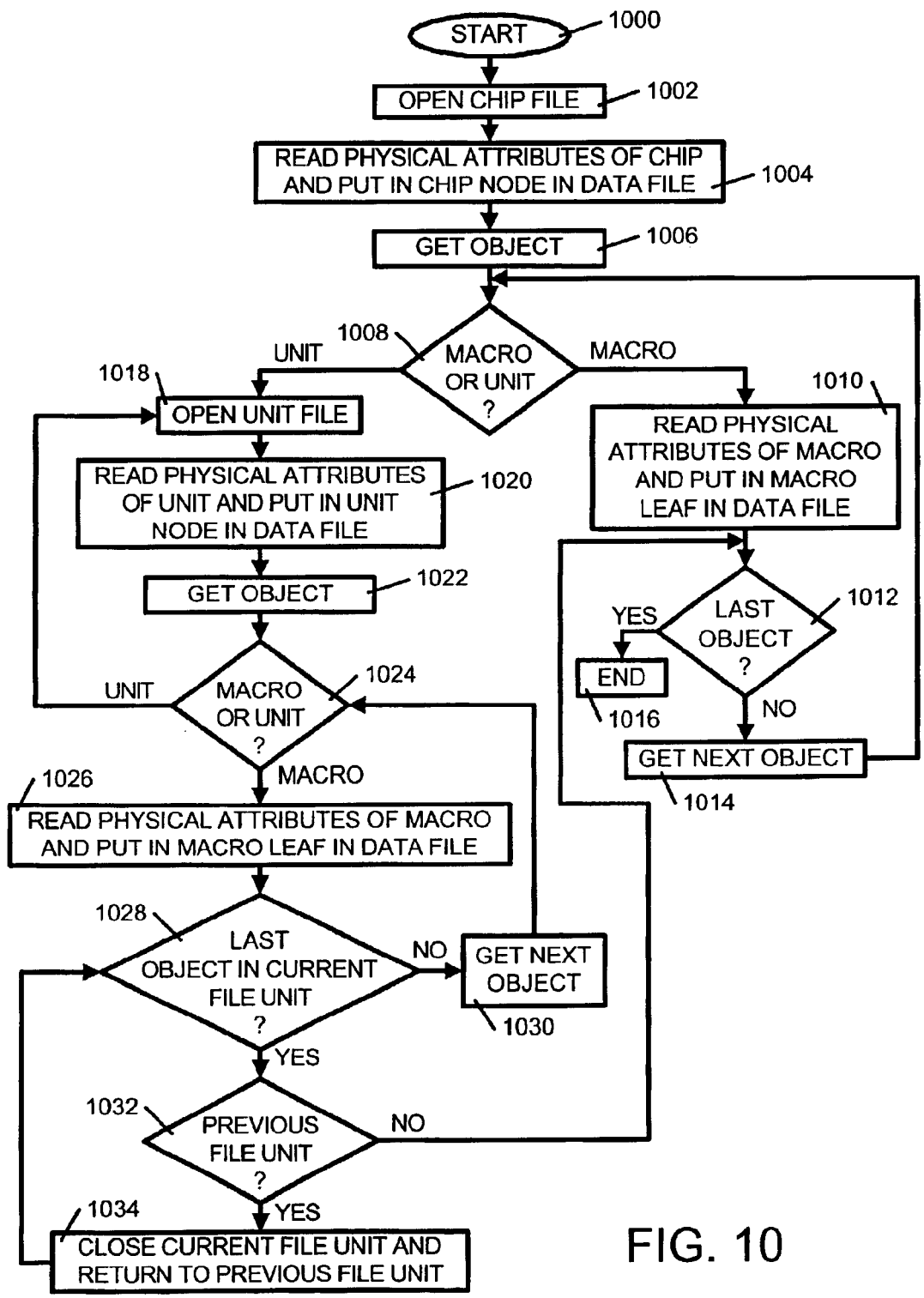
FIG. 10 is a flow diagram of a process used to retrieve physical attributes from the files in FIGS. 2, 3, 4 and 5.

FIG. 10 is a flow chart of a procedure that may be used to retrieve physical attributes of objects from the files in FIGS. 2–5. Physical attributes include reference coordinates, orientation, width and height of all objects as well as power consumption values of the macros. The process starts when the invention is asserted (step 1000). Generally, the chip file will be passed to the invention as an attribute. Once done, the invention will create a database into which all physical attributes retrieved will be stored. The invention will then open the chip file and read the physical attributes of the chip. After retrieving and storing the physical attributes of the chip into the database, the invention will scrutinize the first object in the chip file to determine whether it is a macro or a unit. If the first object is a macro, the invention will read and store the physical attributes of the macro into the database and scrutinize the next object. If the next object is again a macro, the invention will again read and store the physical attributes of the macro. This will continue until the physical attributes of all the objects (macros) are read and stored in the database or a (functional) unit is encountered (steps 1002–1016).

When a (functional) unit is encountered, the invention will open the file associated with the unit to retrieve the unit's physical attributes. After retrieving and storing the unit's physical attributes in the database, the invention will scrutinize the first object in the file. If the first object is a macro, the macro's physical attributes will be retrieved and stored in the database. Then the next object will be scrutinized. Again, if it is a macro its physical attributes will be retrieved and stored. As stated before, this will continue until the physical attributes of all the objects (macros) are read and stored in the database or a (functional) unit is encountered (steps 1018–1030).

Because there may be functional units embedded into a functional unit, there may be a plurality of unit files opened at the same time. However, the invention will only retrieve physical attributes from the last (i.e. current) unit file to have been opened. When the attributes of the last object in a unit file are read and stored, a check is made to determine whether a unit file, opened prior to the current unit file, is till opened. If so, the invention will close the current unit file and will resume retrieving physical attributes of objects from the previously opened (now current) unit file. This will be done all physical attributes of all objects in all the files (unit or chip) are retrieved and stored into the database (steps 1032–1034).

Figure 11:
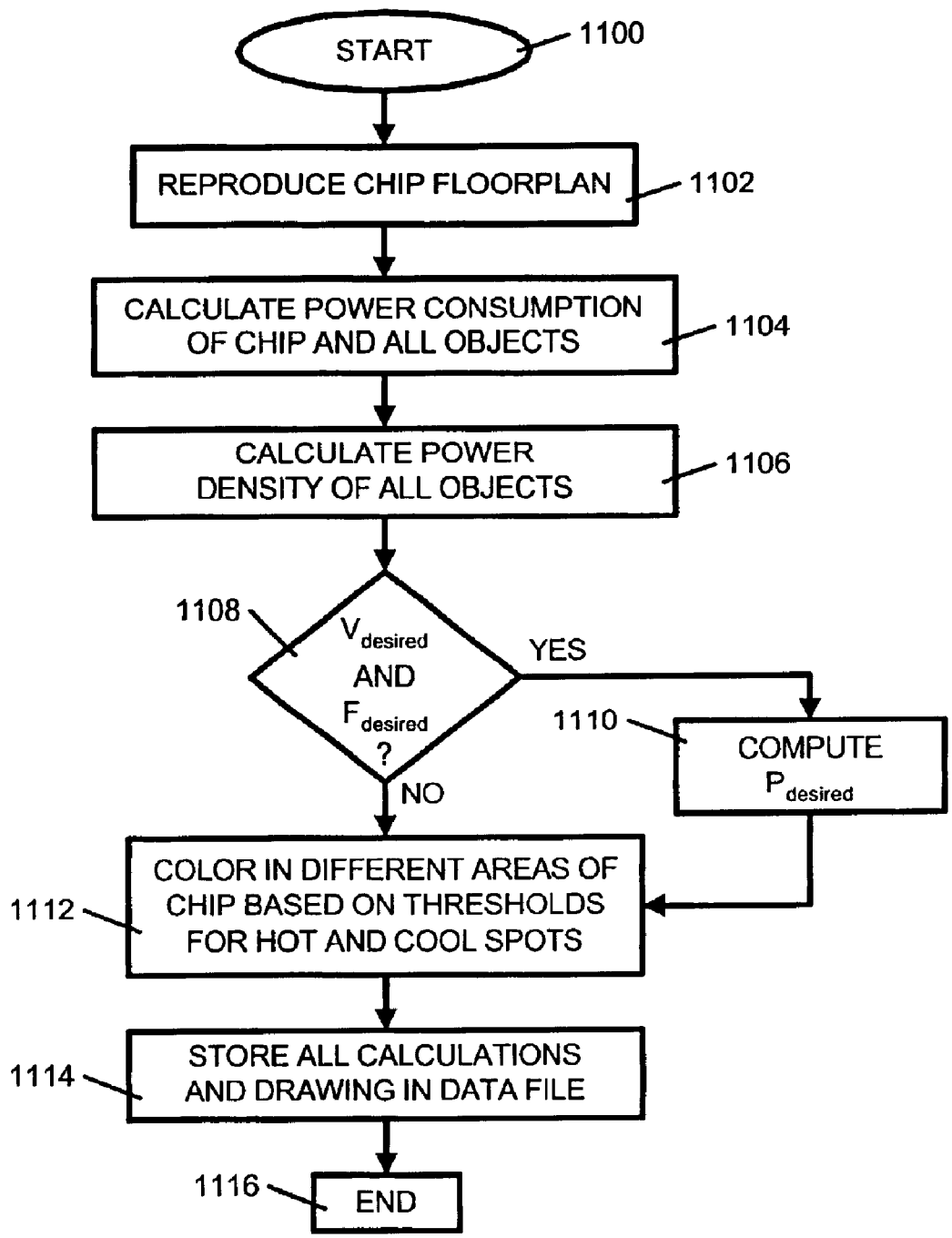
FIG. 11 is a flow diagram of a process used to automatically compute power consumption estimation.

After retrieving the physical attributes of all the objects associated with the chip, the invention may draw the chip floorplan and compute the power estimation and density of the chip as well as those of all the objects in the chip. Further, based on power consumption thresholds, the invention may represent different areas of the chip in different colors to denote hot and cool spots etc. Once done, the invention may store all calculations, drawings etc. into the database. This is illustrated in steps 1100–1116 of FIG. 11.

Figure 12:
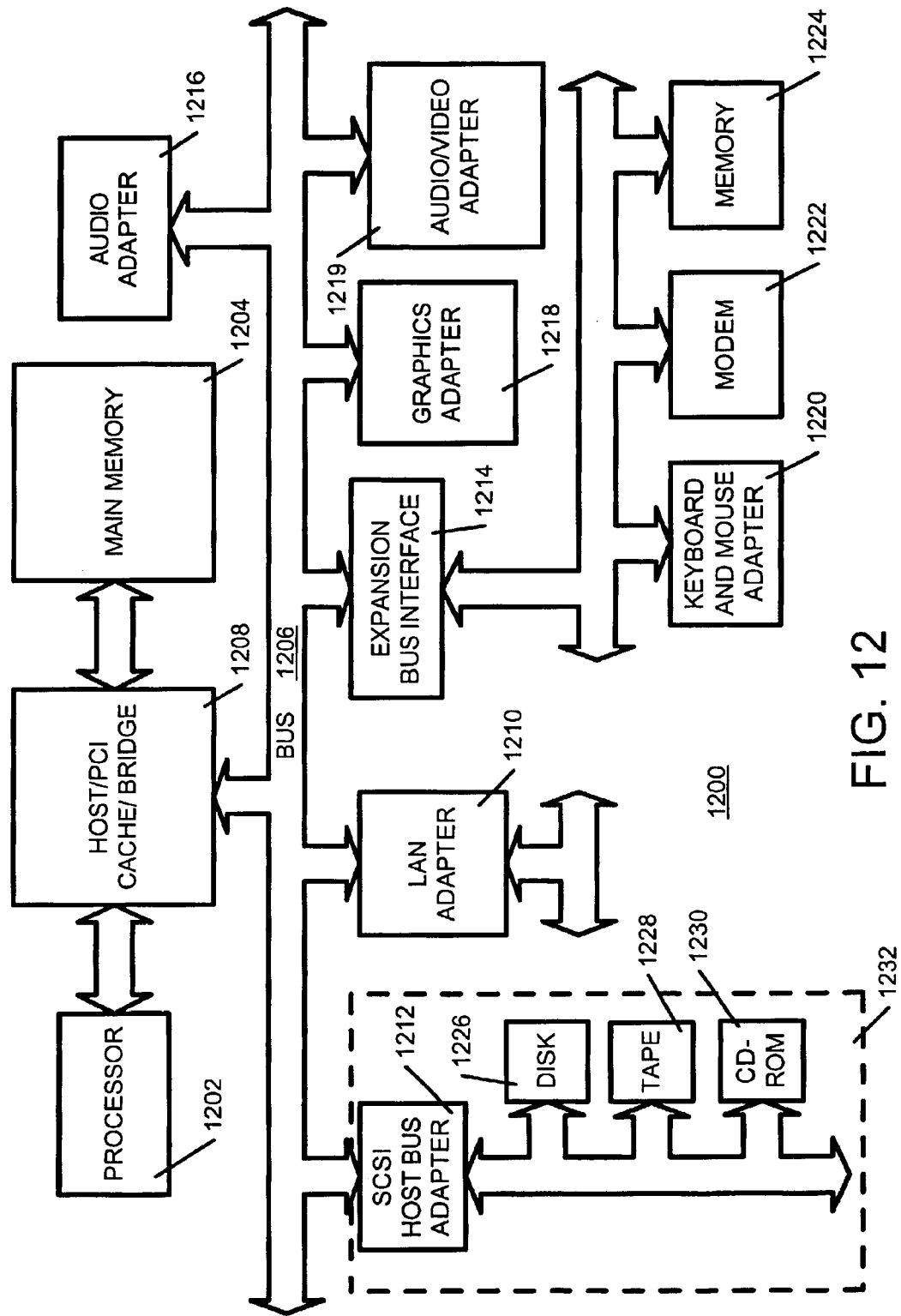
FIG. 12 is a block diagram of a data processor that may be used by the invention.

FIG. 12 is a block diagram of a data processing system on which the invention may be executed. Data processing system 1200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 1202 and main memory 1204 are connected to PCI local bus 1206 through PCI bridge 1208. PCI bridge 1208 also may include an integrated memory controller and cache memory for processor 1202. Additional connections to PCI local bus 1206 may be made through direct component interconnection or through add-in boards. In the depicted example, local area network (LAN) adapter 1210, SCSI host bus adapter 1212, and expansion bus interface 1214 are connected to PCI local bus 1206 by direct component connection. In contrast, audio adapter 1216, graphics adapter 1218, and audio/video adapter 1219 are connected to PCI local bus 1206 by add-in boards inserted into expansion slots. Expansion bus interface 1214 provides a connection for a keyboard and mouse adapter 1220, modem 1222, and additional memory 1224. Small computer system interface (SCSI) host bus adapter 1212 provides a connection for hard disk drive 1226, tape drive 1228, and CD-ROM drive 1230. Typical PCI local bus implementations will support three or four PCI expansion slots or add-in connectors.

An operating system runs on processor 1202 and is used to coordinate and provide control of various components within data processing system 1200 in FIG. 12. The operating system may be a commercially available operating system, such as Windows 2000, which is available from Microsoft Corporation. An object oriented programming system such as Java may run in conjunction with the operating system and provide calls to the operating system from Java programs or applications executing on data processing system 1200. "Java" is a trademark of Sun Microsystems, Inc. Instructions for the operating system, the object-oriented operating system, and applications or programs are located on storage devices, such as hard disk drive 1226, and may be loaded into main memory 1204 for execution by processor 1202.

Those of ordinary skill in the art will appreciate that the hardware in FIG. 12 may vary depending on the implementation. Other internal hardware or peripheral devices, such as flash ROM (or equivalent nonvolatile memory) or optical disk drives and the like, may be used in addition to or in place of the hardware depicted in FIG. 12. Also, the processes of the present invention may be applied to a multi-processor data processing system.

The depicted example in FIG. 3 is not meant to imply architectural limitations. For example, data processing system 1200 may also be a notebook computer or hand held computer. Data processing system 1200 also may be a kiosk or a Web appliance. In any case, the invention may be stored in any memory device employed by the data processing system 1200.

The description of the present invention has been presented for purposes of illustration and description, and is not intended to be exhaustive or limited to the invention in the form disclosed. Many modifications and variations will be apparent to those of ordinary skill in the art. For example, the floorplan, physical attributes etc. of a chip may also be obtained from a design instead from the files generated by the integration tool. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of automatically computing power consumption estimation of a chip comprising the steps of:
   determining all circuit blocks or macros embedded in the chip;
   retrieving from a file a power consumption value for each macro embedded in the chip as well as physical attributes of the chip and each macro embedded in the chip, the physical attributes including size and shape of the chip and macros as well as orientation of each macro within the chip, the physical tributes and the power consumption value being pre-generated and stored in the file; and
   automatically computing the power consumption estimation of the chip.

2. The method of claim 1 wherein desired power consumption estimation is computed, the desired power consumption estimation being dependent on a desired voltage and a desired frequency.

3. The method of claim 1 wherein power densities are computed, a power density being power over an area.

4. The method of claim 3 wherein a floorplan of the chip included all macros is automatically drawn.

5. The method of claim 4 wherein different areas of the floorplan are represented in different colors to indicate hot spots and cool spots, the hot spots and cool spots being based on the calculated power densities.

6. A computer program product on a computer readable medium for automatically computing power consumption estimation of a chip comprising:
   code means for determining all circuit blocks or macros embedded in the chip;
   code means for retrieving from a file a power consumption value for each macro embedded in the chip as well as physical attributes of the chip and each macro embedded in the chip, the physical attributes including size and shape of the chip and macros as well as orientation of each macro within the chip, the physical attributes and the power consumption value being pre-generated and stored in the file; and
   code means for automatically computing the power consumption estimation of the chip.

7. The computer program product of claim 6 wherein desired power consumption estimation is computed, the desired power consumption estimation being dependent on a desired voltage and a desired frequency.

8. The computer program product of claim 6 wherein power densities are computed, a power density being power over an area.

9. The computer program product of claim 8 wherein a floorplan of the chip included all macros is automatically drawn.

10. The computer program product of claim 9 wherein different areas of the floorplan are represented in different colors to indicate hot spots and cool spots, the hot spots and cool spots being based on the calculated power densities.

11. An apparatus for automatically computing power consumption estimation of a chip comprising:
    means for determining all circuit blocks or macros embedded in the chip;
    means for retrieving from a file a power consumption value for each macro embedded in the chip as well as physical attributes of the chip and each macro embedded in the chip, the physical attributes including size and shape of the chip and macros as well as orientation of each macro within the chip, the physical attributes and the power consumption value being pre-generated and stored in the file; and
    means for automatically computing the power consumption estimation of the chip.

12. The apparatus of claim 11 wherein desired power consumption estimation is computed, the desired power consumption estimation being dependent on a desired voltage and a desired frequency.

13. The apparatus of claim 11 wherein power densities are computed, a power density being power over an area.

14. The apparatus of claim 13 wherein a floorplan of the chip included all macros is automatically drawn.

15. The apparatus of claim 14 wherein different areas of the floorplan are represented in different colors to indicate hot spots and cool spots, the hot spots and cool spots being based on the calculated power densities.

16. A system for automatically computing power consumption estimation of a chip comprising:
    at least one storage device for storing code data; and
    at least one processor for processing the code data to determine all circuit blocks or macros embedded in the chip, to retrieve from a file a power consumption value for each macro embedded in the chip and physical attributes of the chip and each macro embedded in the chip, the physical attributes including size and shape of the chip and macros as well as orientation of each macro within the chip, the physical attributes and the power consumption value being pre-generated and stored in the file, and to automatically compute the power consumption estimation of the chip.

17. The system of claim 16 wherein desired power consumption estimation is computed, the desired power consumption estimation being dependent on a desired voltage and a desired frequency.

18. The system of claim 16 wherein power densities are computed, a power density being power over an area.

19. The system of claim 18 wherein a floorplan of the chip included all macros is automatically drawn.

20. The system of claim 19 wherein different areas of the floorplan are represented in different colors to indicate hot spots and cool spots, the hot spots and cool spots being based on the calculated power densities.

* * * * *

UNITED STATES PATENT AND TRADEMARK OFFICE
CERTIFICATE OF CORRECTION

PATENT NO. : 6,865,722 B2
DATED : March 8, 2005
INVENTOR(S) : Chen et al.

It is certified that error appears in the above-identified patent and that said Letters Patent is hereby corrected as shown below:

Column 7,
Line 46, please replace "tributes" with "attributes".

Signed and Sealed this

Thirty-first Day of May, 2005

JON W. DUDAS
*Director of the United States Patent and Trademark Office*